United States Patent
Hornung et al.

(10) Patent No.: US 7,098,099 B1
(45) Date of Patent: Aug. 29, 2006

(54) SEMICONDUCTOR DEVICE HAVING OPTIMIZED SHALLOW JUNCTION GEOMETRIES AND METHOD FOR FABRICATION THEREOF

(75) Inventors: Brian E. Hornung, Richardson, TX (US); Jong Yoon, Plano, TX (US); Deborah J. Riley, Richardson, TX (US); Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/064,583

(22) Filed: Feb. 24, 2005

(51) Int. Cl.
 *H01L 21/8238* (2006.01)
(52) U.S. Cl. ............ 438/229; 438/230; 438/231; 438/232; 438/756
(58) Field of Classification Search ........... 438/229, 438/230, 231, 232, 756
See application file for complete search history.

(56) References Cited

U.S. PATENT DOCUMENTS

| | | | | |
|---|---|---|---|---|
| 4,757,026 A | * | 7/1988 | Woo et al. ............ | 438/231 |
| 6,093,594 A | * | 7/2000 | Yeap et al. ............ | 438/231 |
| 6,489,207 B1 | * | 12/2002 | Furukawa et al. ......... | 438/301 |
| 2002/0046757 A1 | * | 4/2002 | Inagaki et al. ......... | 134/18 |
| 2004/0043549 A1 | * | 3/2004 | Sayama et al. ......... | 438/197 |
| 2005/0245021 A1 | * | 11/2005 | Hornung et al. ......... | 438/231 |

* cited by examiner

*Primary Examiner*—Trung Dang
(74) *Attorney, Agent, or Firm*—Peter K. McLarty; W. James Brady, III; Frederick J. Telecky, Jr.

(57) ABSTRACT

The present invention provides, in one embodiment, a method of fabricating a semiconductor device (100). In one embodiment, the method includes growing an oxide layer 120 from a substrate 104, 106 over a first dopant region 122 and a second dopant region 128, implanting a first dopant through the oxide layer 120, into the substrate 104 in the first dopant region 122, and adjacent a gate structure 114, and substantially removing the oxide layer 120 from the substrate within the second dopant region 128. Subsequent to the removal of the oxide layer 120 in the second dopant region 128, a second dopant that is opposite in type to the first dopant is implanted into the substrate 106 and within the second dopant region 128 and adjacent a gate structure 114.

18 Claims, 6 Drawing Sheets

SEMICONDUCTOR DEVICE HAVING OPTIMIZED SHALLOW JUNCTION GEOMETRIES AND METHOD FOR FABRICATION THEREOF

TECHNICAL FIELD OF THE INVENTION

The present invention is directed in general to the manufacture of semiconductor devices, and, more specifically, to a method of fabricating transistor devices having optimized shallow junctions.

BACKGROUND OF THE INVENTION

The continuing push to produce faster semiconductor devices with lower power consumption has resulted in the miniaturization of semiconductor devices. In particular, smaller gate oxide thickness and channel length are conducive to the low voltage and faster operation of transistor devices, such as complementary metal oxide semiconductor (CMOS) transistors. With shrinking process geometries, comes a number of new design problems, however.

For instance, as gate dimensions are reduced, it has become necessary to adjust and better control the dimensions of the channel and doped regions of the substrate that are associated with the gate. This is necessary to prevent a number of short channel effects such as, threshold voltage variation, drain induced barrier lowering (DIBL), punch-through leakage currents, hot carrier injection and mobility degradation.

Consider, for instance, the dimensions of shallow junctions and pocket region structures. Shallow junctions, also referred to as source drain extensions, or light or medium-doped drain (LDD and MDD, respectively) regions, are implanted as extensions to the larger and more heavily doped source and drain regions, to reduce hot carrier injection-induced damage to gate dielectric layers and improve short channel effects. Hot carriers, electrons with higher than average energy, form because of the stronger electric fields produced in small transistor device geometries. Shallow junctions, implanted before sidewall formation and source and drain implantation, provide a doping gradient between the source and drain regions and the channel. The lowered electric field in the vicinity of the channel region of such devices reduces the formation of hot carriers.

Sub-0.1 micron transistor devices are also highly susceptible to leakage currents, or punch-through, when the transistor is off. Leakage currents can be reduced if the shallow junctions are formed with well-defined boundaries, as exemplified by an abrupt decrease in dopant concentration, to support low-voltage operation of the transistor and to define the width of the channel region of the transistor. The formation of abrupt shallow junctions can be problematic in certain instances, however.

For, instance, to establish p-type doped shallow junctions in a positive channel metal oxide semiconductor (PMOS) transistor, a typical p-type dopant is boron ($B^+$). Small dopants, such as boron, are subject to undesirable enhanced diffusion into implantation-caused damage to the lattice structures of silicon substrates during thermal annealing. This phenomenon, known as transient enhanced diffusion (TED), is undesirable because it decreases the abruptness of the change in dopant concentrations from the shallow junction to a p-well or n-well where the shallow junction is formed. TED deters the formation of shallow junctions having suitably shallow depths (e.g., less than about 40 nm). TED can also cause dopants, such as boron, to diffuse into the channel region, thereby causing an unfavorable change in the dopant concentration in the channel resulting in short channel effects such as, drain induced barrier lowering (DIBL), punch-through, threshold voltage variation, which increases transistor leakage.

Another approach to reduce leakage currents is to implant a lightly doped pocket or halo region, containing dopants of the opposite dopant type of the shallow junction, around the edges of the shallow junction. The dopants in the pocket region provide increases resistance in the channel region to reduce or prevent leakage currents. However, if the pocket regions on the source and drain sides of the transistor's channel region are too close to each other, then the pocket regions will overlap. Overlap, in turn, causes excessively high resistance in the channel region, degrading mobility thereby undesirably reducing the on-current of the device.

One approach to reduce excessively close shallow junctions or overlapping pockets regions, is to introduce off-set spacers on the sides of gates prior to dopant implantation. The off-set spacers act as mask during the implantation of dopants to prevent dopants of the source and drain shallow junctions or pocket regions from being too close to each after the transistor is thermally annealed. This approach is not entirely successful, however, because the extent of diffusion of p-type and n-type dopants during thermal annealing are substantially different than each other.

Heretofore, however, the fabrication processes for PMOS and NMOS transistors in CMOS devices have resulted in the formation of shallow junctions having substantially the same geometries. As such, the geometries of one or both of the NMOS and PMOS shallow junctions have not been simultaneously optimized in both transistor types. Because current CMOS devices are constructed with compromised NMOS and PMOS shallow junction geometries, the performance of these devices is also compromised.

Accordingly, what is needed in the art is an improved method of manufacturing a PMOS shallow junction that is optimized to provide more robust electrical characteristics.

SUMMARY OF THE INVENTION

To address the above-discussed deficiencies of the prior art, the present invention provides a method of fabricating a semiconductor device. In one embodiment, the method includes growing an oxide layer from a substrate over a first dopant region and a second dopant region, implanting a first dopant through the oxide layer, into the substrate in the first dopant region, and adjacent a gate structure, and substantially removing the oxide layer from the substrate within the second dopant region with a buffered hydrofluoric acid (BHF) solution, wherein a ratio of parts of ammonium fluoride to parts of the hydrofluoric acid is at least about 300:1, such that the protective layer is not substantially damaged or removed. Subsequent to the removal of the oxide layer in the second dopant region, a second dopant that is opposite in type to the first dopant is implanted into the substrate and within the second dopant region and adjacent a gate structure.

In another embodiment, the present invention provides a method of fabricating an integrated circuit. In one embodiment the method includes forming metal oxide semiconductor (MOS) transistor devices that includes forming a first gate structure over a first dopant region and forming a second gate structure over a second dopant region, growing an oxide layer from a substrate over the first and second dopant regions, implanting a first dopant through the oxide layer, into the substrate in the first dopant region, and adjacent the first gate structure. The oxide layer is substantially removed from the substrate within the second dopant region with a buffered hydrofluoric acid (BHF) solution wherein a ratio of parts of ammonium fluoride to parts of the hydrofluoric acid is at least about 300:1, such that a the protective layer is not substantially damaged or removed. Subsequent to the removal of the oxide layer in the second dopant region, a second dopant that is opposite in type to the first dopant is implanted into the substrate and within the second dopant region and adjacent a gate structure. The method further includes interconnecting the MOS transistor devices with interconnects located in dielectric layers overlying the MOS transistor devices to form an operative integrated circuit.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes the advantages associated with removing a protective oxide layer over the PMOS device region prior to implanting P-type LDD's adjacent the PMOS device gate. It has been discovered that, by removing the oxide layer prior to the LDD implant, a more uniform and consistent implant of the P-type dopant can be achieved. As such, the electrical properties of the devices made using such processes fall within a narrower range of deviation, thereby providing for more consistent devices across the wafer.

Figure 1A:
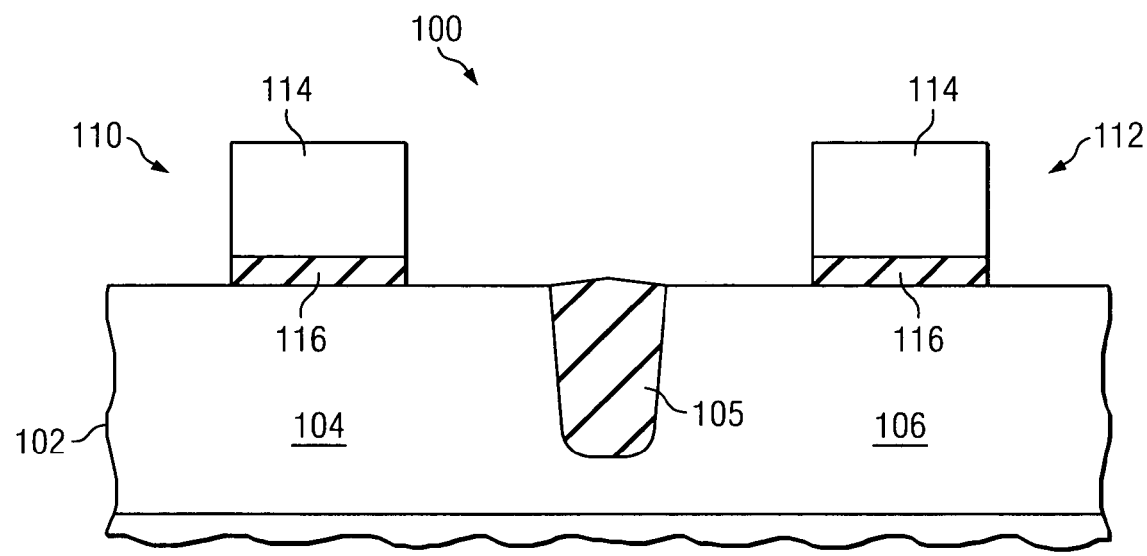
FIGS. 1A to 1I illustrate partial sectional views of selected steps in a method for fabricating a semiconductor device according to the principles of the present invention.

One embodiment of the present invention is shown in FIGS. 1A to 1H, which illustrate sectional views of selected steps, at various stages of manufacture, of a method for fabricating a semiconductor device 100. Turning first to FIG. 1A, illustrated is a partial sectional view of a conventionally formed semiconductor substrate 102, such as a silicon wafer. First and second portions of the substrate 104, 106 can be conventionally formed p-type and n-type substrates, respectively, separated by a conventional isolation trench 105. In such embodiments, the p-type substrate 104 is doped with and a p-type dopant, such as boron, while the n-type substrate 106 is preferably doped with an n-type dopant, such as arsenic, phosphorus, or both. In some embodiments, the isolation trench 105 is formed to a depth of about 400 nm, using conventional procedures, such as lithography and chemical vapor deposition (CVD) techniques to form shallow trench isolation structures.

Conventional processes are used to form gate structures, such as first and second gate structure 110, 112, each comprising a gate 114 and gate dielectric 116. In certain configurations, the gate structure includes an NMOS gate structure 110 and a PMOS gate structure 112. The gate 114 preferably comprises polysilicon, and the gate dielectric 116 comprises silicon oxide, although other well-known dielectric materials may also be used. As well known to those skilled in the art, silicon oxide and polysilicon layers can be formed over the substrate 102, and then patterned using lithography techniques to form the gate structures 110, 112 depicted in FIG. 1A.

Figure 1B:
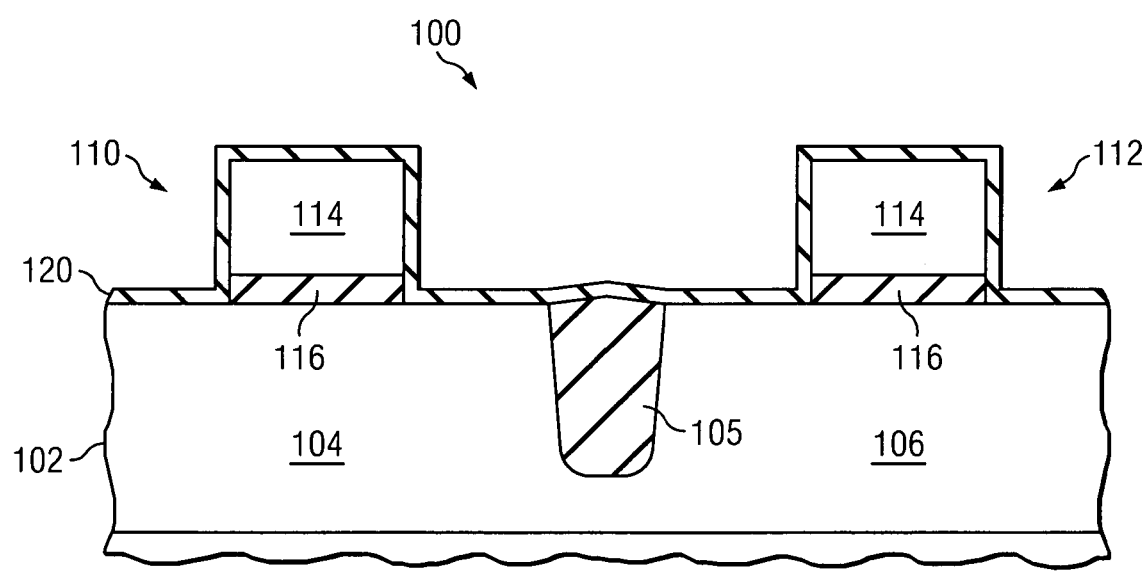

Referring now to FIG. 1B, there is illustrated the partially completed transistor device 100 of FIG. 1A after growing an oxide layer 120 on the gate structure 110, 112 and the substrate 102. The oxide layer 120 advantageously repairs damage to the gate structure 110, 112, caused by conventional etching processes used to form the gate structures 110, 112. While its thickness can vary, a thickness of the oxide layer 120 preferably ranges between about 1 nm and about 5 nm and is conformally grown on the gate structure 110, 112 and substrate 102. In certain advantageous embodiments, the oxide layer 120 is a layer of silicon oxide thermally grown by subjecting the partially completed device to a temperature ranging from about 600 to about 900° C. for a time ranging from about 10 to about 100 minutes in an oxygen containing environment. In certain preferred embodiments, oxide layer 120 is grown over both the first and second gate structures 110, 112 in a single growth step.

Figure 1C:
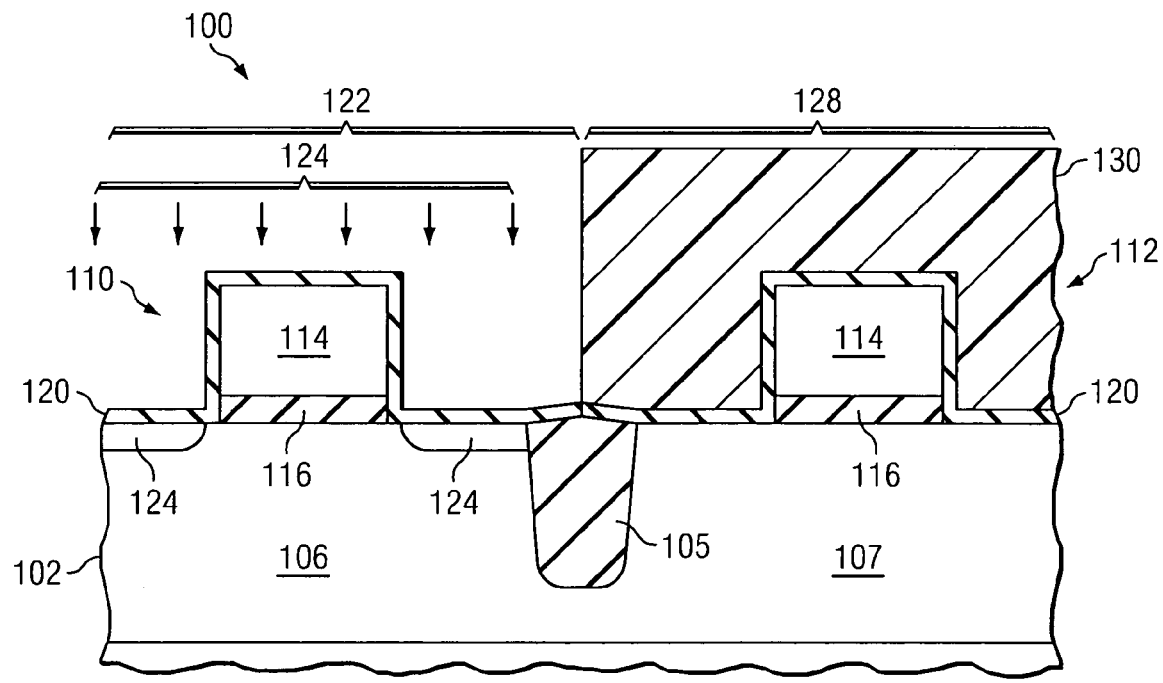

Turning now to FIG. 1C, the partially completed device 100 is depicted, while conventionally implanting a dopant 124 into the substrate 102 in the NMOS region. In the illustrated embodiment, the dopant 124 is an n-type dopant, such as phosphorus, arsenic, or a combination thereof. Implantation can be conducted in such a way that a portion of the dopant 124 may remain in the oxide layer 120. During implantation, the NMOS device 110, which is located in first dopant region 122, is exposed to the dopant 124. During such implantation, a second dopant region 128, which in this embodiment is the region in which the PMOS device 112 is located, is protected from exposure to the n-type dopant 124 by an overlying protective layer 130, such as conventionally formed photoresist. The gate structure 110 advantageously acts as a mask to define the portion of the substrate 102 associated with the NMOS device 110 that is exposed to the dopant 124.

Of course, the selection of dopant 124 type depends on the type of device being fabricated. In the illustrated embodiment, however, an arsenic dopant 124 is implanted at a dose ranging from about $2 \times 10^{14}$ to about $4 \times 10^{15}$ atoms/cm$^2$, and more preferably from about $5 \times 10^{14}$ to about $1 \times 10^{15}$ atoms/cm$^2$. Implanting also preferably includes applying an acceleration energy of between about 0.5 and about 5 keV, and more preferably ranging from about 0.5 and about 2 keV. At such energies, a portion of the n-type dopant 124 may remain in the oxide layer 120, while the remaining dopant 124 is implanted into the underlying substrate 102 to form the regions as shown.

Figure 1D:
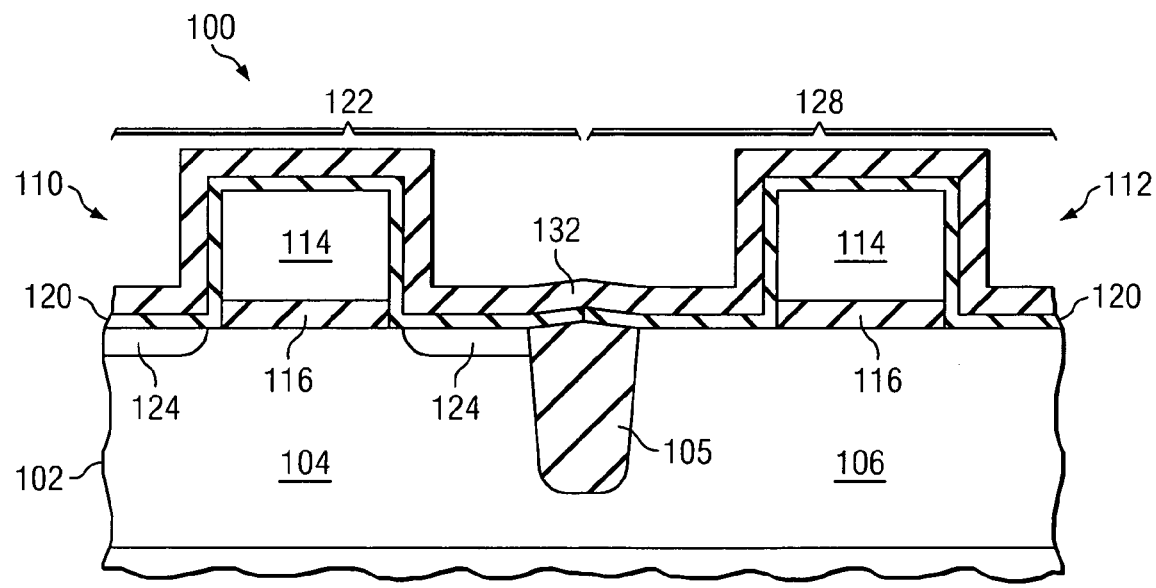

FIG. 1D shows the partially completed transistor device 100, after removal of the protective layer 130 and blanket deposition of a protective oxide layer 132 over the grown oxide layer 120. The protective oxide layer 132 advantageously serves as an etch stop during formation of an off-set layer as discussed below. The protective oxide layer 132 also can prevent the removal of the oxide layer 120, during wet or dry etching, which is further described below. Additionally, the protective oxide layer 132 inhibits out-diffusion of the dopant 124 during a thermal anneal.

As illustrated in FIG. 1D, the protective oxide layer 132 conforms to the surface of the oxide layer 120 and therefore, forms adjacent sidewalls on the gate structures 110, 112. The protective oxide layer 132 can be deposited by CVD as a silicon dioxide, using a precursor, such as tetraethyl orthosilicate (TEOS). The thickness of the protective layer 132 may vary. However, in an advantageous embodiment, the protective oxide layer 132 has a thickness of ranging from about 2.5 nm to about 10 nm.

Figure 1E:
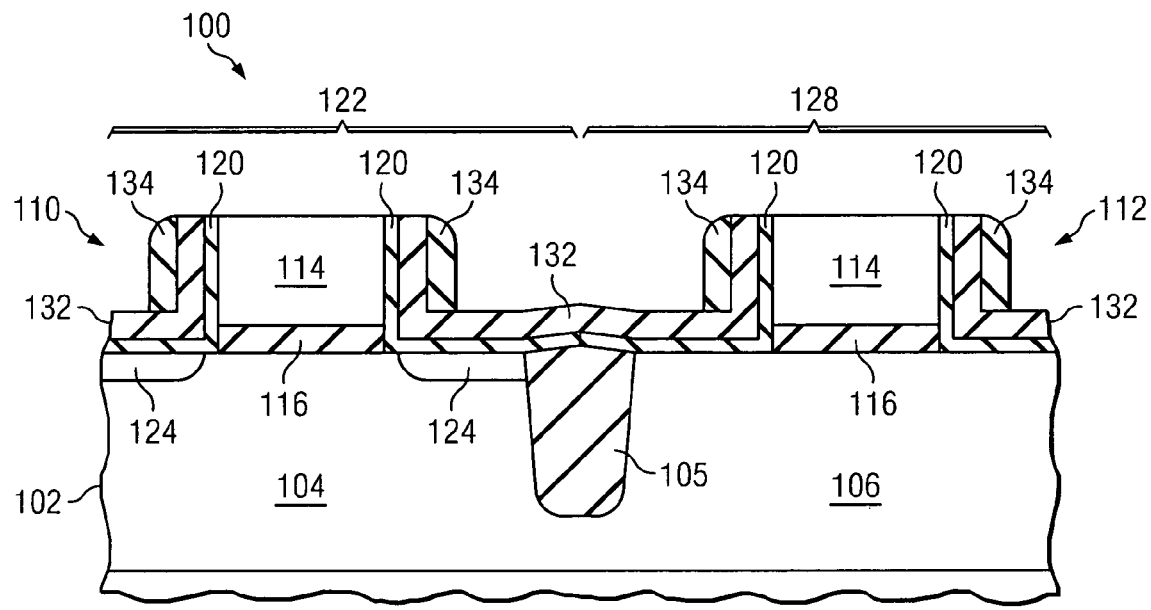

Turning now to FIG. 1E, illustrated is the partially completed transistor device 100, after conventionally forming etch-resistant off-set spacers 134 adjacent sidewalls of the gate structure 110, 112 and on the protective oxide layer 132. In certain preferred embodiments, the etch-resistant off-set spacers 134 are formed adjacent sidewalls of both the first and second gate structures 110, 112, as shown. The offset spacers 134 serve as a mask layer to separate regions that will form LDD regions after thermal annealing, as discussed below. In addition, the etch-resistant offset spacers 134 advantageously serve as an etch stop to prevent the removal of the oxide layer 120.

In some advantageous configurations, the etch-resistant off-set spacer is an oxide etch-resistant off-set spacer 134. That is, the oxide etch-resistant off-set spacer 134 has a higher resistance to wet etchants, such aqueous hydrofluoric acid, than the protective oxide layer 132. The oxide etch-resistant off-set spacer 134 facilitates removal of portions of the protective oxide layer. Suitable materials comprising the etch-resistant off-set spacers 134 include silicon nitride and silicon oxynitride.

In certain preferred embodiments, the etch-resistant off-set spacer 134 is formed by blanket deposition of a layer of etch-resistant material, such as silicon nitride, over the protective oxide layer 132 by chemical vapor deposition. Portions of the etch-resistant material are then removed by an anisotropic etch, such as a reactive ion etch (RIE), which results in the configuration shown in the illustrated embodiment. The etch-resistant off-set spacer 134 can have a horizontal thickness ranging from about 2.5 nm to about 10 nm. However, the thickness can vary, depending on the design.

Figure 1F:
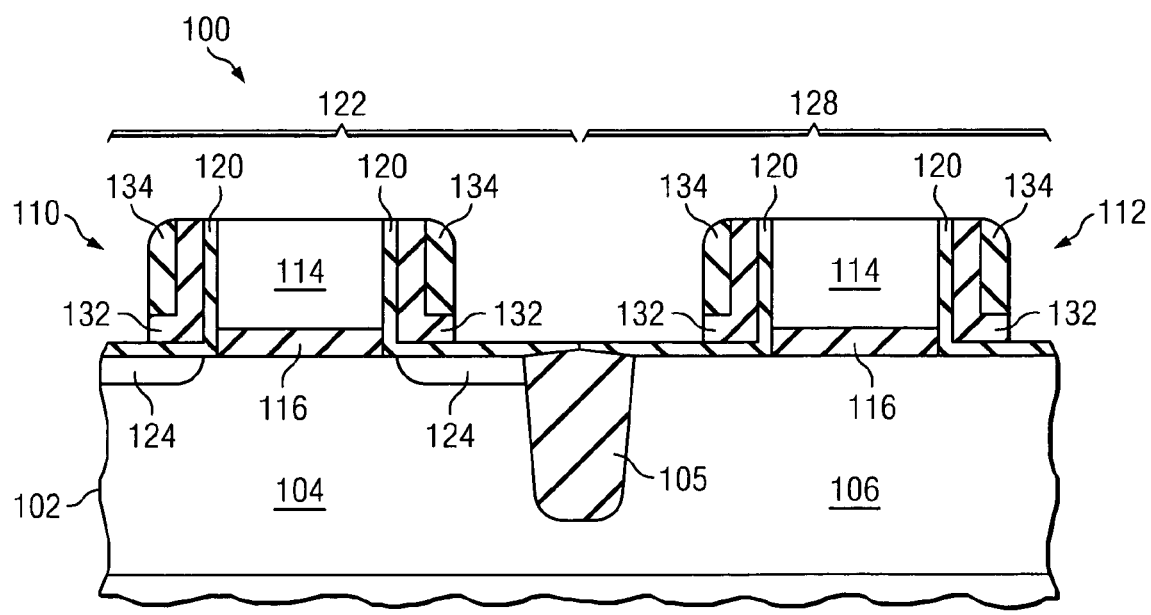

FIG. 1F shows the partially completed transistor device 100 after removing portions of the protective oxide layer 132, shown in FIG. 1E, lying outside of the outer perimeter of the etch-resistant off-set spacers 136. The portions of the protective oxide layer 132 that are removed lay over portions of the substrate that are separated from the gate structures 110, 112 by the off-set spacers 134. Portions of the protective oxide layer 132 can be removed by exposing the partially completed transistor device 100 to a wet etchant, such an aqueous solution of hydrogen fluoride (HF), in a wet-etch chamber.

Figure 1G:
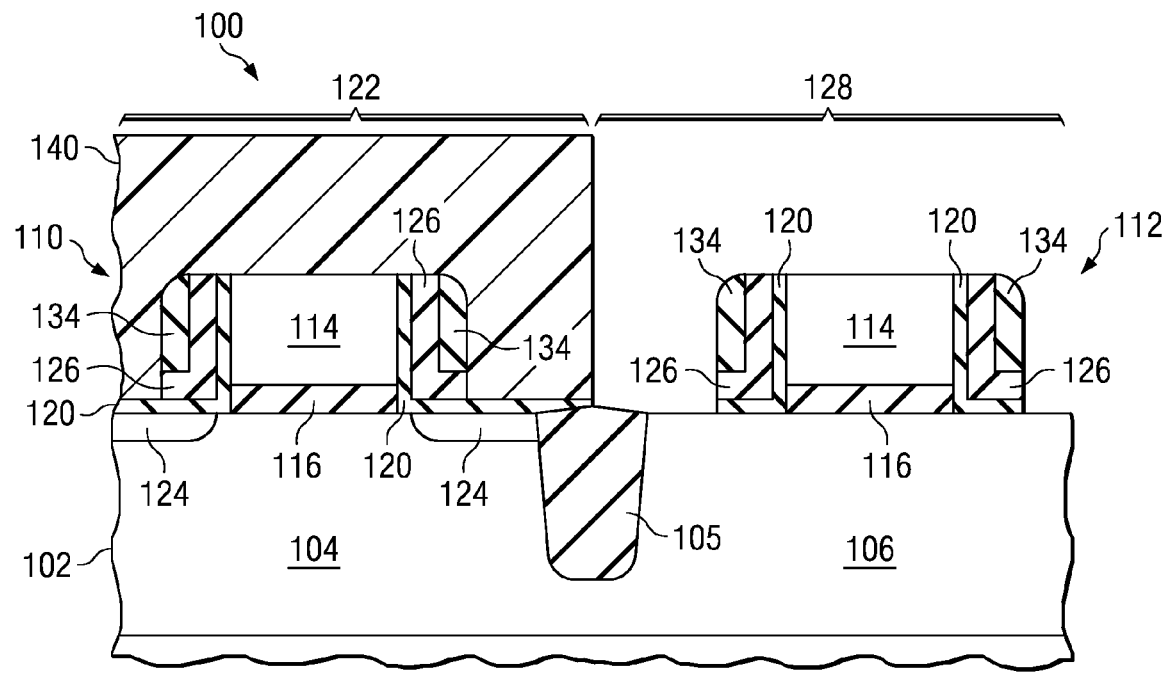

Turning now to FIG. 1G, the partially completed transistor device 100 is illustrated in preparation for a second implantation in the second dopant region 128, which includes the PMOS device 112. In this aspect of the invention, a protective layer 140, such as a photoresist, is conventionally deposited and patterned to expose the oxide layer 120 within the second dopant region 128. With the present invention, it has been realized that it is highly advantageous to substantially remove the oxide layer 120 from the substrate within the second dopant region 128 prior to conducting a PLDD implant with respect to the PMOS device 112. Preferably, it is desirable to remove at least about 50% of the thickness of the oxide layer 120, and it is even more preferable to remove all of it without significantly over etching the underlying silicon surface. However, it should be understood, of course, that in such instances some over etch into the underlying silicon might occur given the variations that exist across the wafer. Variation across the wafer also causes variation, including thickness, within the grown oxide layer 120. With the present invention, it has been discovered that this variation negatively influences the implant in the second dopant region 128. For example, the variation can cause the implant depth to vary. This variability in the implants can change the abruptness, the profile, and the overlap, all or any of which, can affect the electrical properties of the device, such as drive current or off current.

In one embodiment, the present invention provides substantially removing the oxide layer 120 within the second dopant region 128 with a buffered hydrofluoric acid (HF) solution. While the constituents of the buffered HF solution may vary, in one embodiment the, buffered HF solution comprises ammonium fluoride and hydrofluoric acid. In such embodiments, a ratio of parts of ammonium fluoride to parts of hydrofluoric acid ranges from about 100:1 to about 1000:1, and in one exemplary embodiment, the ratio is about 300:1. In yet another embodiment, the buffered HF solution further comprises water, wherein a ratio of parts of ammonium fluoride to parts of water to parts of hydrofluoric acid is about 300:300:1. It should be understood that other methods known to those skilled in the art can be used to substantially or completely remove the oxide layer 120 prior to the second implant. However, it is highly advantageous that, whatever method is used to remove the oxide layer 120, it does not damage or remove a significant portion of the protective layer 140. Damage to the protective layer 140 can negatively affect the second implant and significant removal of the protective layer 140 may allow implantation of the second dopant into the first dopant region 122.

Figure 1H:
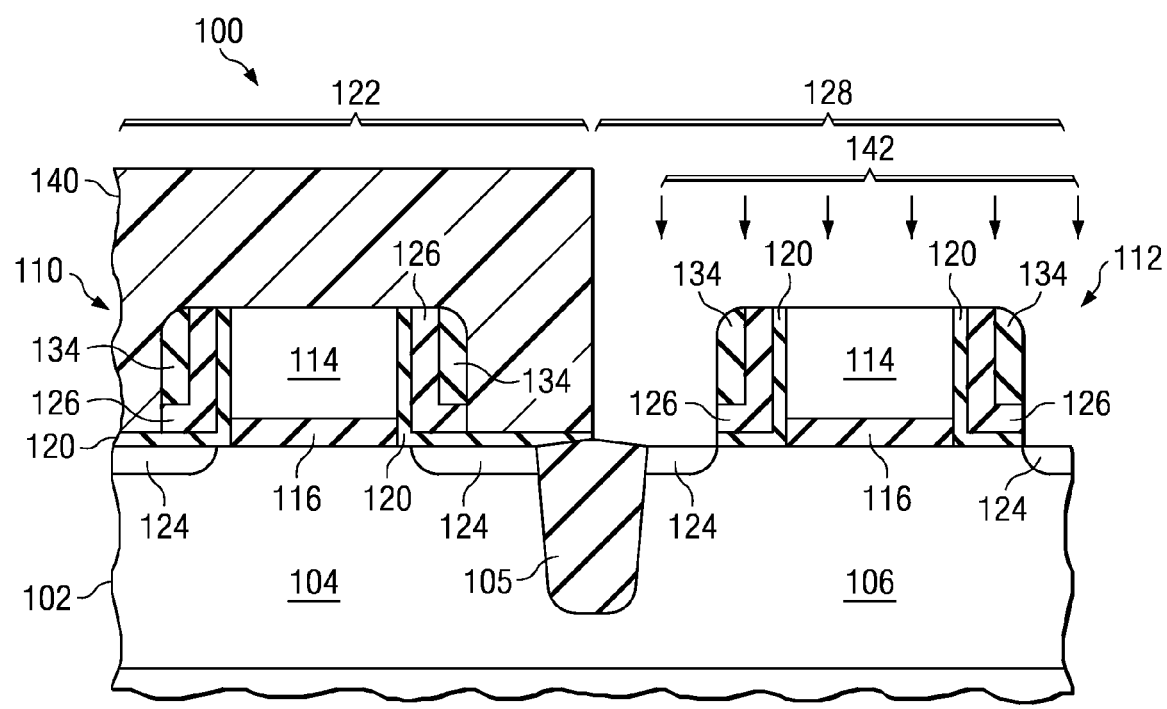

Turning now to FIG. 1H, shown is the transistor device 100, during the implantation of a second dopant 142 into the substrate 102. Preferably, the second dopant 142 is of the opposite dopant type as the first implanted dopant 124. As an example, where the first dopant 124 is an n-type dopant, the second dopant 142 is a p-type dopant, such as boron, and is implanted into the second dopant region 128, which may be doped with an n-type dopant. Analogous to that described above, the second gate structure 112, advantageously serves as a mask to define the portion of the substrate 102 that is exposed to the second dopant 142. In one embodiment, the dopant used during the implant is a P-type dopant, such as boron and the implant dose ranges from about 4E14 atoms/$cm^2$ to about 4E15 atoms/$cm^2$ and at an energy ranging from about 1 keV to about 5 keV.

Figure 1I:
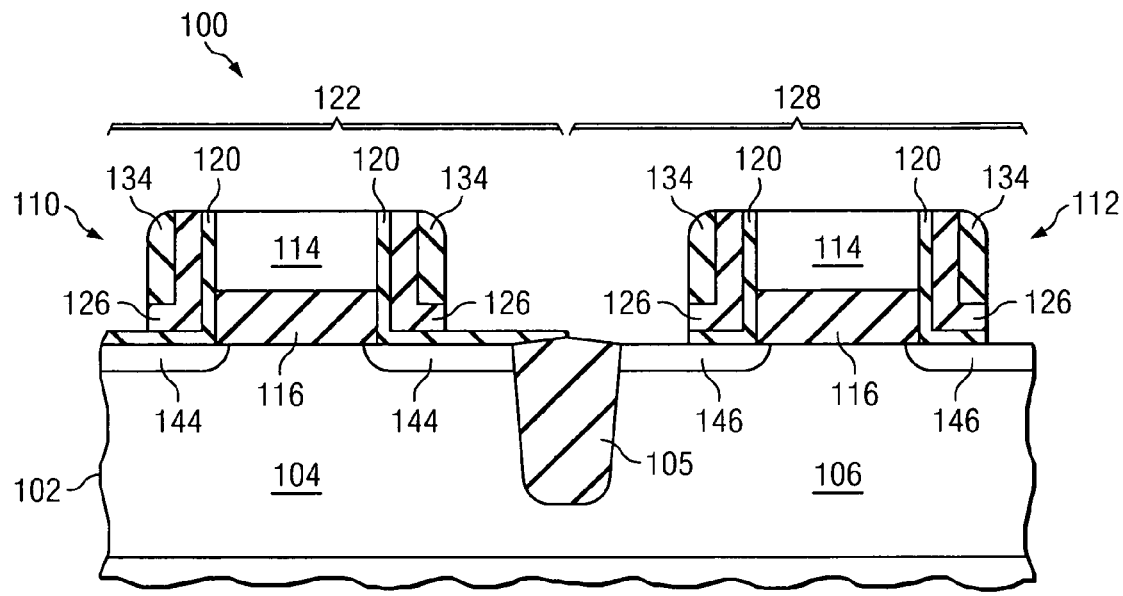

Turning now to FIG. 1I, illustrated is an embodiment of the partially completed transistor device 100 after performing a thermal anneal to form first and second dopant-type LDD or MDD regions 144, 146. In this embodiment, the first and second dopant-type LDD regions 144, 146 are n-type and p-type LDD regions, respectively. The thermal anneal is performed at a sufficient temperature and duration so as cause the first and second dopants 124, 142 to diffuse from the implanted oxide layer 126 and surface regions of the substrate 102, to deeper levels in the substrate. The thermal anneal also advantageously serves to activate the dopants, 124, 142, as well understood by those skilled in the art.

Preferably, only one thermal anneal is performed to form the LDD regions 144, 146 in both the first and second dopant regions 122, 128. That is, the thermal anneal is done after implanting both the first and second dopants 124, 142, as described above. The thermal anneal can comprise heating to a temperature ranging from about 900 to about 1100° C. for up to about 30 seconds, although other conditions may be used to suit the particular dopants 124, 140 being used.

In alternative aspects, however, two thermal anneals are performed. In such embodiments, a first thermal anneal is done after implanting the dopant 124 into the first portion of the substrate 122 and oxide layer 126, such as depicted in FIG. 1C. A second thermal anneal is then done after implanting the second dopant 142 in the second portion of the substrate 128, such as illustrated in FIG. 1G. Preferably, the first thermal anneal comprises heating to a temperature ranging from about 800° C. to about 1000° C. for up to about 30 seconds, and the second thermal anneal comprises heating to a temperature ranging from about 1000° C. to about 1100° C. for up to about 5 seconds.

Figure 2:
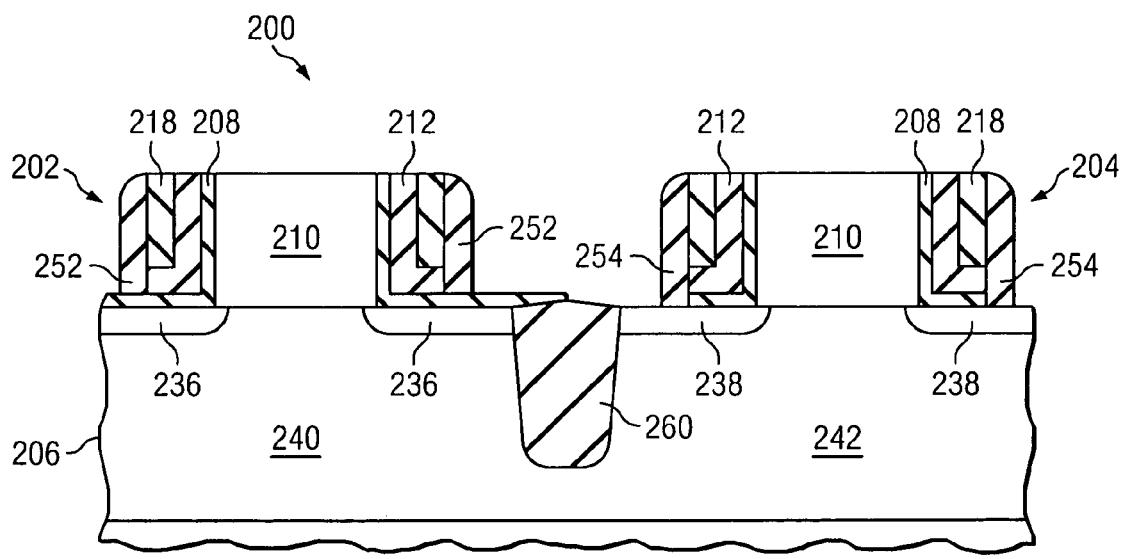
FIG. 2 illustrates a partial sectional view of metal oxide semiconductor (MOS) transistor devices constructed according to the principles of the present invention.

FIG. 2 illustrates another aspect of the present invention, a metal oxide semiconductor (MOS) transistor device 200. Any of the above-described embodiments of the methods for manufacturing the semiconductor device 100 depicted in FIGS. 1A–1H may be used to fabricate the MOS devices 200 depicted in FIG. 2. The MOS transistor device 200 includes gate structures 202, 204 on a substrate 206. In submicron applications, the gate structures 202, 204 preferably have a length of less than about 50 nm, and in many application will be complementary NMOS and PMOS structures.

The device 200 also includes an oxide layer 208 on a sidewall of each of the gate structures 210 and on a portion of the substrate 206 adjacent the gate structures 210. The oxide layer 208 can be from about 1 nm to about 8 nm thick, although other thicknesses can be used to suit particular device applications. The device 200 further includes a protective oxide layer 212 on the oxide layer 208. The thickness of the protective oxide layer 212 may range from about 2.5 nm to about 10 nm, and more preferably, from about 5 nm to about 10 nm. In such embodiments, the protective oxide layer 212 thereby forms an L-, or horizontally inverted-L-, structure.

The device 200 further includes an oxide etch-resistant off-set spacer 218 adjacent and located on the protective oxide layer 212. The etch-resistant off-set spacer can have a thickness ranging from about 2.5 nm and to about 10 nm, and more preferably, from about 5 nm to about 8 nm. In desirable configurations, the NMOS and PMOS transistors 202, 204 include n-type and p-type LDD or MDD regions 236, 238, respectively. Any of the above-described methods can be used to form n-type and p-type LDD regions 236, 238 within the p-type substrates and n-type substrates 240, 242 of the NMOS and PMOS transistors 202, 204, respectively. A depth of the n-type LDD regions 236 are preferably about 30 to about 50 percent shallower than a depth of the p-type LDD regions. For instance, in certain embodiments, the n-type LDD regions 236 have a substantially constant arsenic concentration of greater than about $1 \times 10^{20}$ atoms/$cm^3$ until a depth of from about 20 nm to about 25 nm. In other embodiments, the p-type LDD regions 238 have a substantially constant boron concentration of greater than about $1 \times 10^{20}$ atoms/$cm^3$ until a depth ranging from about 35 nm to about 40 nm. Of course, the depths and dopant concentrations in the n-type and p-type LDD regions 236, 238 can be varied according to particular device application requirements.

In certain advantageous embodiments of the transistor device 200, the n-type and p-type LDD regions 236, 238 formed according to the above-described methods of the present invention are separated by different amounts. For instance, the two n-type LDD regions 236 can be closer together than the two p-type LDD regions 238, as illustrated. As an example, the two n-type LDD regions 236 on either side of the first gate structure 232 are separated by a distance that is about 20 percent closer than the distance separating the two p-type LDD regions 238 on either side of the second gate structure 234. Consequently, channel region between the n-type LDD regions 236 has a width that ranges from about 10 nm to about 50 nm, and a width of the channel region between the p-type LDD regions 238 ranges from about 10 nm to about 50 nm.

FIG. 2 also depicts other conventionally formed device structures, including gate sidewall spacers 256, 258, and shallow trench isolation structure 260, included in preferred embodiments to form an active transistor device 200. Not shown, but is understood by those who are skilled in the art, deep source/drain implants may also be conducted to complete the source/drain regions of the MOS transistors.

Figure 3:
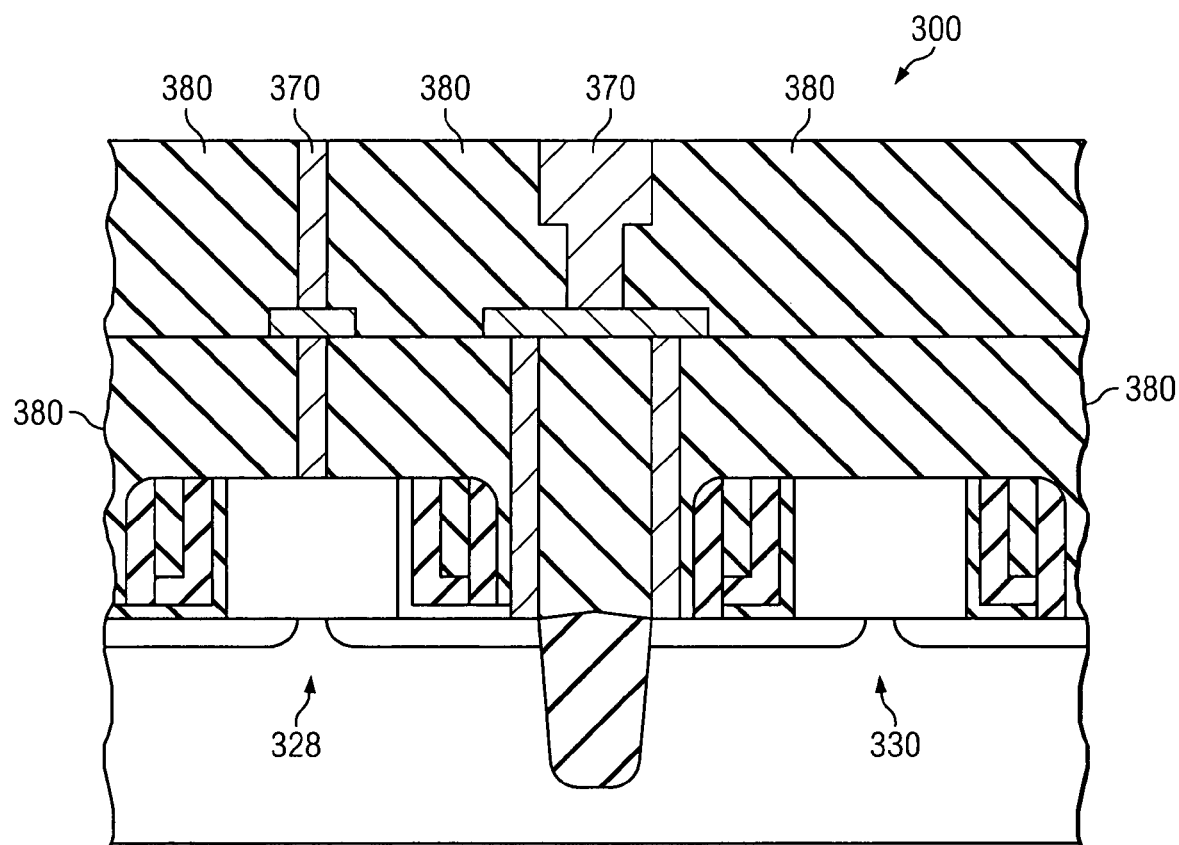
FIG. 3 illustrates a partial sectional view of an integrated circuit that can be constructed according to the principles of the present invention.

FIG. 3 illustrates a partial view of an integrated circuit 300. FIG. 3, briefly illustrates a partial completed integrated circuit 300, after interconnecting the MOS transistor device 328, 330 with interconnects 370 to form an operative integrated circuit 300. Certain preferred embodiments, of the method of manufacturing the integrated circuit 300 further includes using conventional method to form interlevel dielectric levels 380. Those who are skilled in the art would understand how to build the completed integrated circuit, given the teachings of the present invention.

Although the present invention has been described in detail, one of ordinary skill in the art should understand that they can make various changes, substitutions and alterations herein without departing from the scope of the invention.

What is claimed is:

1. A method of fabricating a semiconductor device, comprising:
    growing an oxide layer from a substrate over a first dopant region and a second dopant region;
    implanting a first dopant through the oxide layer, into the substrate in the first dopant region, and adjacent a gate structure;
    forming a protective layer over the first dopant region;
    substantially removing the oxide layer from the substrate within the second dopant region with a buffered hydrofluoric acid (BHF) solution wherein a ratio of parts of ammonium fluoride to parts of the hydrofluoric acid is at least about 300:1, such that the protective layer is not substantially damaged or removed;
    implanting a second dopant opposite in type to the first dopant into the substrate within the second dopant region, adjacent a gate structure, and subsequent to substantially removing the oxide layer.

2. The method as recited in claim 1, wherein substantially removing includes substantially removing the oxide layer.

3. The method as recited in claim 1, wherein a ratio of parts of ammonium fluoride to part of hydrofluoric acid ranges to about 1000:1.

4. The method as recited in claim 1 wherein the buffered HF solution further comprises water, wherein a ratio of parts of ammonium fluoride to parts of water to parts of hydrofluoric acid is about 300:300:1.

5. The method as recited in claim 1 wherein the second dopant is a P-type dopant and the gate structure within the second dopant type region is a positive channel metal oxide semiconductor (PMOS) gate structure.

6. The method as recited in claim 5, wherein implanting the P-type dopant includes implanting boron at a dose ranging from about 4E14 atoms/cm$^2$ to about 4E15 atoms/cm$^2$ and at an energy ranging from about 1 keV to about 5 keV.

7. The method as recited in claim 1, further includes thermally annealing after implanting the first and second dopants, comprising heating the substrate to a temperature of between about 900 and about 1100° C. for up to about 30 seconds to form a first and second dopant LDD regions in the substrate and respectively within the first and second dopant regions.

8. The method as recited in claim 1, wherein substantially removing includes removing at least about 50% of a thickness of the oxide layer.

9. The method as recited in claim 8 wherein the oxide layer is completely removed.

10. The method as recited in claim 1 further including covering the first dopant region with a etch resistant mask during substantially removing the oxide layer from the substrate.

11. A method of manufacturing an integrated circuit, comprising:
   forming metal oxide semiconductor (MOS) transistor devices, including:
      forming a first gate structure over a first dopant region and forming a second gate structure over a second dopant region;
      growing an oxide layer from a substrate over the first and second dopant regions;
      implanting a first dopant through the oxide layer, into the substrate in the first dopant region, and adjacent the first gate structure;
      forming a protective layer over the first dopant region;
      substantially removing the oxide layer from the substrate within the second dopant region with a buffered hydrofluoric acid (BHF) solution, wherein a ratio of parts of ammonium fluoride to parts of hydrofluoric acid is at least about 300:1, such that a the protective layer is not substantially damaged or removed; and
      implanting a second dopant opposite in type to the first dopant into the substrate within the second dopant region, adjacent a second gate structure, and subsequent to substantially removing the oxide layer; and
   interconnecting the MOS transistor devices with interconnects located in dielectric layers overlying the MOS transistor devices.

12. The method as recited in claim 11, wherein a ratio of parts of ammonium fluoride to part of hydrofluoric acid ranges to about 1000:1.

13. The method as recited in claim 11 wherein the buffered HF solution further comprises water, wherein a ratio of parts of ammonium fluoride to parts of water to parts of hydrofluoric acid is about 300:300:1.

14. The method as recited in claim 11 wherein the second dopant is a P-type dopant and the gate structure within the second dopant type region is a positive channel metal oxide semiconductor (PMOS) gate structure.

15. The method as recited in claim 14, wherein implanting the P-type dopant includes implanting boron at a dose ranging from about 4E14 atoms/cm$^2$ to about 4E15 atoms/cm$^2$ and at an energy ranging from about 1 keV to about 5 keV.

16. The method as recited in claim 11, further includes thermally annealing after implanting the first and second dopants, comprising heating the substrate to a temperature of between about 900 and about 1100° C. for up to about 30 seconds to form a first and second dopant LDD regions in the substrate and respectively within the first and second dopant regions.

17. The method as recited in claim 11, wherein growing the oxide layer includes growing an oxide layer to a thickness ranging from about 1 nm to about 5 nm and substantially removing includes removing at least about 50% of the thickness of the oxide layer.

18. The method as recited in claim 11 wherein the oxide layer is completely removed.

* * * * *